(12) United States Patent
Leidy

(10) Patent No.: US 6,815,319 B2
(45) Date of Patent: Nov. 9, 2004

(54) DAMASCENE RESISTOR AND METHOD FOR MEASURING THE WIDTH OF SAME

(75) Inventor: Robert K. Leidy, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/447,646

(22) Filed: May 29, 2003

(65) Prior Publication Data
US 2003/0197276 A1 Oct. 23, 2003

Related U.S. Application Data

(62) Division of application No. 10/079,092, filed on Feb. 20, 2002, now Pat. No. 6,620,635.

(51) Int. Cl.[7] .......................... H01L 21/22; H01L 21/38
(52) U.S. Cl. ........................................ 438/543; 438/759
(58) Field of Search ................................ 438/543, 759, 438/359, 363, 379, 380

(56) References Cited

U.S. PATENT DOCUMENTS

| | | | |
|---|---|---|---|
| 4,024,561 A | 5/1977 | Ghatalia | |
| 4,347,479 A | 8/1982 | Cullet | |
| 4,399,205 A | 8/1983 | Bergendahl | |
| 4,516,071 A | 5/1985 | Buehler | |
| 4,659,936 A | 4/1987 | Kikkawa et al. | |
| 4,871,962 A | 10/1989 | Cheung | |
| 4,978,923 A | 12/1990 | Maltiel | |
| 5,485,080 A | 1/1996 | Larrabee et al. | |
| 5,497,076 A | 3/1996 | Kuo et al. | |
| 5,552,718 A | 9/1996 | Bruce et al. | |
| 5,834,795 A | 11/1998 | Lee | |
| 5,928,820 A | 7/1999 | Park et al. | |
| 5,963,784 A | 10/1999 | Bothra et al. | |
| 5,989,623 A | 11/1999 | Chen et al. | |
| 6,030,732 A | 2/2000 | Liu | |
| 6,057,171 A | 5/2000 | Chou et al. | |
| 6,066,952 A | 5/2000 | Nowak et al. | |
| 6,072,897 A | 6/2000 | Greenberg et al. | |
| 6,087,189 A | 7/2000 | Huang | |
| 6,150,669 A | 11/2000 | Nandakumar et al. | |
| 6,171,951 B1 | 1/2001 | Lee et al. | |
| 6,204,073 B1 | 3/2001 | Nandakumar et al. | |
| 6,207,222 B1 | 3/2001 | Chen et al. | |
| 2003/0089987 A1 * | 5/2003 | Parikh | 257/758 |

FOREIGN PATENT DOCUMENTS

JP    4168763 A2    6/1992

OTHER PUBLICATIONS

US 6,150,664, 11/2000, Su (withdrawn)
IBM Disclosure, Pattern and Structure for Measuring Electrically Both Lines and Spaces of an Insulator, vol. 32, No. 12, May 1990, Burbo et al., pp. 240–241.
IBM Disclosure, Electrical Test Structure for Accurate Measurement of Line Width Tolerance of Ultra–Narrow MOS FET Gates, vol. 36, No. 06B, Jun. 1993, Burghartz et al., pp. 243–244.

* cited by examiner

*Primary Examiner*—Craig A. Thompson
(74) *Attorney, Agent, or Firm*—Schmeiser, Olsen & Watts; William D. Sabo

(57) ABSTRACT

A linewidth measurement structure for determining linewidths of damascened metal lines formed in an insulator is provided. The linewidth measurement structure including: a damascene polysilicon line formed in the insulator, the polysilicon line having an doped region having a predetermined resistivity.

5 Claims, 8 Drawing Sheets

DAMASCENE RESISTOR AND METHOD FOR MEASURING THE WIDTH OF SAME

This application is a divisional of Ser. No. 10/079,092; filed on Feb. 20, 2002 now U.S. Pat. No. 6,620,635.

FIELD OF THE INVENTION

The present invention relates to the field of linewidth measurement; more specifically, it relates to a semiconductor damascene resistor and a method of forming and measuring the width of the resistor.

BACKGROUND OF THE INVENTION

In the fabrication of semiconductor structures, the increasing density of devices (transistors, diodes, resistors and capacitors), including the isolation and interconnect structures between devices, has resulted in the devices, isolation, and interconnects becoming increasingly smaller. This, in turn, has produced the need for high-resolution photolithography. Devices utilizing sub-micron linewidths are now routinely fabricated.

Accurate measurement of sub-micron linewidths to characterize the photolithography process is difficult. Linewidths have long since passed the practical optical linewidth measurement limit. Scanning electron microscopy (SEM) measurement is not always satisfactory because of charging effects and because an SEM measures linewidths over only a portion of an entire line. Further, this technique is slow, especially when there is a need to take hundreds of measurements across a single die or thousands across a wafer.

A faster technique is to measure the linewidth electrically. In electrical linewidth measurement the sheet resistance of a conductive material is determined using a test structure, then a known current is passed along second test structure having a line fabricated from the same material. If the line is of known length and thickness, then the linewidth can be calculated from the sheet resistance and the voltage drop along the known length of line. Linewidth measurement of a line formed by subtractive means is well known. To measure a damascene line is more challenging. In a damascene process, a conductive line is formed by etching a trench in an insulator, depositing a layer of conductive material on the top surface of the insulator of a thickness sufficient to fill the trench and then chemical-mechanical-polishing (CMP) the excess conductive material until the top surface of the insulator is exposed again.

FIG. 1 is a cross-section view through a conductive damascene line, illustrating an ideal cross-sectional profile. In FIG. 1, an insulator 100 is formed on top of a substrate 105. Formed in insulator 100 is a damascene conductor 110. Damascene conductor 110 has sidewalls 115, a bottom 120 and a top surface 125. Top surface 125 is co-planar with a top surface 130 of insulator 100. In the idealized structure, the cross-section of conductor 110 is a perfect rectangle. Particularly, sidewalls 115 are perpendicular to top surface 125, the top surface is perfectly flat and co-planar with top surface 130 of insulator 100. Damascene conductor 110 is "W" wide by "T" thick, where "T" is a function only of the depth of the trench after CMP. The resistance R of damascene conductor 110 is given by the formula:

$$R = \rho L / WT \quad (1)$$

where $\rho$ is the resistivity of damascene conductor 110 and L is the length (into the plane of the drawing sheet) of the damascene conductor. Electrical linewidth measurement relies on L and T being accurately known and $\rho$ and R being accurately measured.

However, because this linewidth measurement technique assumes the thickness of lines of the same linewidth do not vary from line to line, the technique is not accurate when sub-micron damascene structures need to be measured because the thickness does vary due to the nature of the damascene fabrication process. The CMP process is not uniform all over the die or wafer. Depending upon line density and linewidth, some lines will be dished, some lines will be eroded and some will be ideal, as in FIG. 1. Worse, lines of the same width may exhibit different amounts of dishing and erosion depending on the local line density.

FIG. 2A a cross-section view through a conductive damascene line illustrating the effect of dishing on the cross-sectional profile of FIG. 1. In FIG. 2A, top surface 125A of conductor 110 is concave instead of flat. The true cross-sectional area of conductor 110 is now a function of the depth of the trench after CMP and of the dishing profile. Dishing is caused by localized differences in pressure caused by localized differences in area ratio of harder line fill material to softer insulating layer material. Obviously, if test structure line profiles vary from ideal to different degrees of dished across the die or wafer, the measurement will not accurately reflect a true linewidth or a true linewidth variation across the die or wafer because the thickness term in equation (1) is no longer accurately known.

FIG. 2B is a cross-section view through a conductive damascene line illustrating the effect of erosion on the cross-sectional profile of FIG. 1. In FIG. 2B, top surface 125B of conductor 110 is recessed a distance "D" from top surface 130 of insulator 100. The true thickness of conductor 110 is now a function of the depth of the trench after CMP and of the depth "D" of erosion. Erosion is caused by localized differences in pressure caused by localized differences in the number of line edges resulting in faster insulator layer removal in areas having more edges. Again, if test structure line profiles vary from ideal to different degrees of erosion across the die or wafer, the measurement will not accurately reflect a true linewidth or a true linewidth variation across the die or wafer because the thickness term in equation (1) is no longer accurately known.

It would be desirable to provide an electrical linewidth measurement structure and method, not affected by thickness variation, especially those variations caused by the CMP process.

SUMMARY OF THE INVENTION

A first aspect of the present invention is a linewidth measurement structure for determining linewidths of damascened metal lines formed in an insulator comprising: a damascene polysilicon line formed in the insulator, the polysilicon line having a doped region having a predetermined resistivity.

A second aspect of the present invention is A method of fabricating a linewidth measurement structure for determining linewidths of damascened metal lines formed in an insulator comprising: forming a trench in the insulator; filling the trench with polysilicon; planarizing the polysilicon to form a polysilicon line; and ion implanting a dopant species and annealing to form within the polysilicon line a doped region having a predetermined resistivity.

A third aspect of the present invention is a method of characterizing the photolithographic process for forming a damascened metal line in an insulating layer of a semiconductor device comprising: forming a trench in the insulating layer using the photolithographic process for forming damascened metal lines; filling and planarizing the trench with polysilicon to form a polysilicon line; forming a doped region in the polysilicon region, the doped region having a predetermined resistivity greater than a resistivity of the material of the damascened metal line; and measuring the effective width of the trench by measuring the resistance of the polysilicon line.

A fourth aspect of the present invention is a resistor, comprising: a damascened polysilicon line formed in a first insulator, the polysilicon line having a first region having a first dopant concentration and a second region having a second dopant concentration, the first dopant concentration being greater than the second dopant concentration; a second insulator formed on a top surface of the first insulator; a first via formed in the second insulator, the first via electrically contacting the first region at a first end of the polysilicon line; and a second via formed in the second insulator, the second via electrically contacting the first region at a second end of the polysilicon line.

A method of fabricating a resistor, comprising: forming a damascened polysilicon line in a first insulator, the polysilicon line having a first region having a first dopant concentration and a second region having a second dopant concentration, the first dopant concentration being greater than the second dopant concentration; forming a second insulator a top surface of the first insulator; forming a first via formed in the second insulator, the first via electrically contacting the first region at a first end of the polysilicon line; and forming a second via formed in the second insulator, the second via electrically contacting the first region at a second end of the polysilicon line.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 11 and 12 are cross-sectional views illustrating a method of forming contact to the structure of FIG. 10 to form a high precision polysilicon resistor according to the present invention; and.

DETAILED DESCRIPTION OF THE INVENTION

Figure 1:
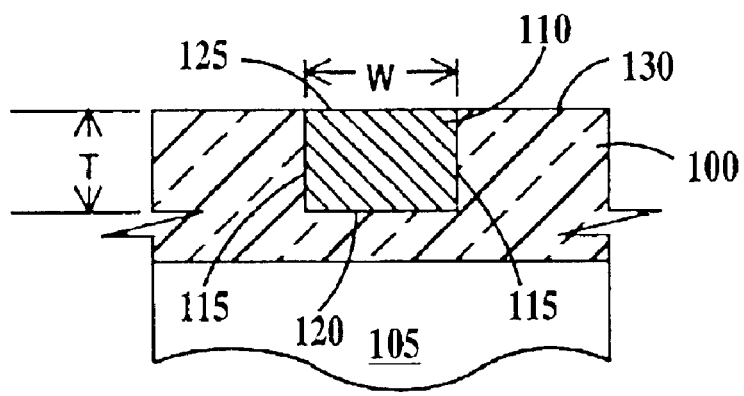
FIG. 1 is a cross-section view through a conductive damascene line, illustrating an ideal cross-sectional profile.
Figure 2A:
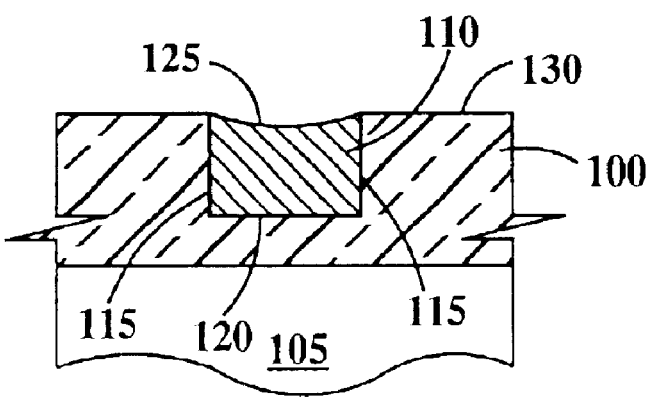
FIG. 2A is a cross-section view through a conductive damascene line illustrating the effect of dishing on the cross-sectional profile of FIG. 1.
Figure 2B:
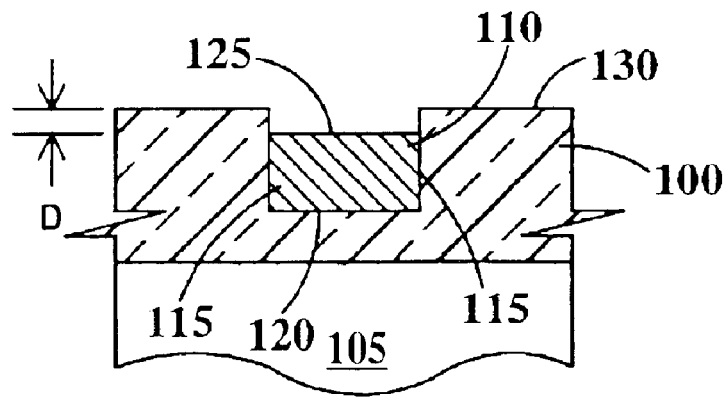
FIG. 2B is a cross-section view through a conductive damascene line illustrating the effect of erosion on the cross-sectional profile of FIG. 1.
Figure 3:
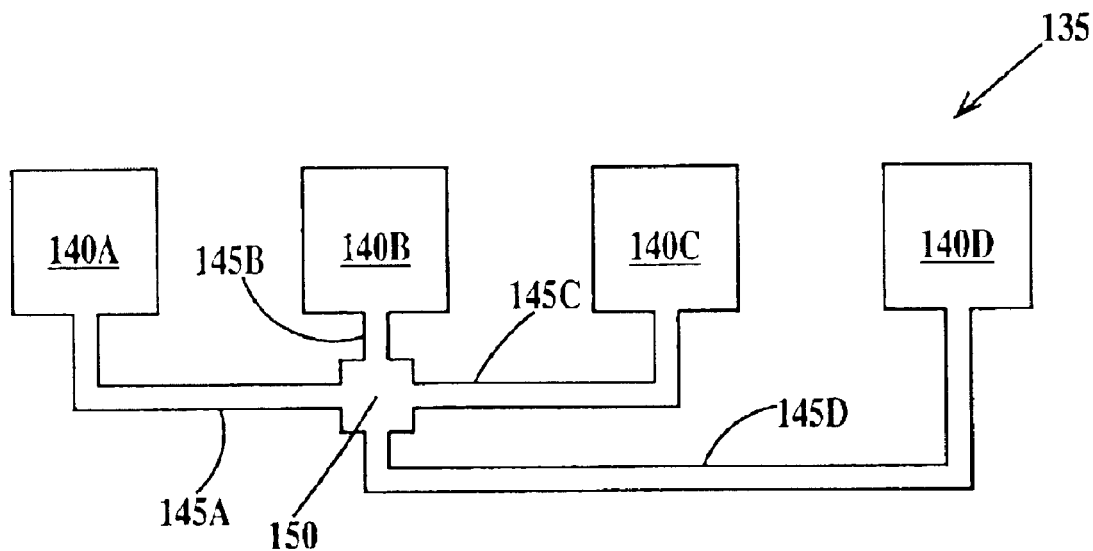
FIG. 3 is an illustrative plan view of a Van der Pauw structure for measuring sheet resistance.

FIG. 3 is an illustrative plan view of a Van der Pauw structure for measuring sheet resistance. In FIG. 3, a Van der Pauw sheet resistance structure 135 used to determine the sheet resistance of the conductive material that is used to fabricate the test structure illustrated in FIG. 4, and described below. Van der Pauw sheet resistance structure 135 comprises a plurality of pads 140A, 140B, 140C and 140D connected by conductive lines 145A, 145B, 145C and 145D to a hub 150, the pads, conductive lines, and hub being integrally formed from the same material by a damascene process as illustrated in FIGS. 5 through 10 and described below. The sheet resistance $R_s$ of the material is determined by first passing a known current $I_1$ through pads 140B and 140C while measuring the resulting voltage drop $V_1$ between pads 140A and 140D to obtain a first resistance value $R_1=V_1/I_1$ and then passing the same current $I_1$ through pads 140C and 140D while measuring the voltage drop $V_2$ between pads 140A and 140B to obtain a second resistance value $R_2=V_2/I_1$. The sheet resistance $R_s$ may then be calculated using the following formula:

$$R_s=4.532(R_1+R_2)/2 \qquad (2)$$

Figure 4:
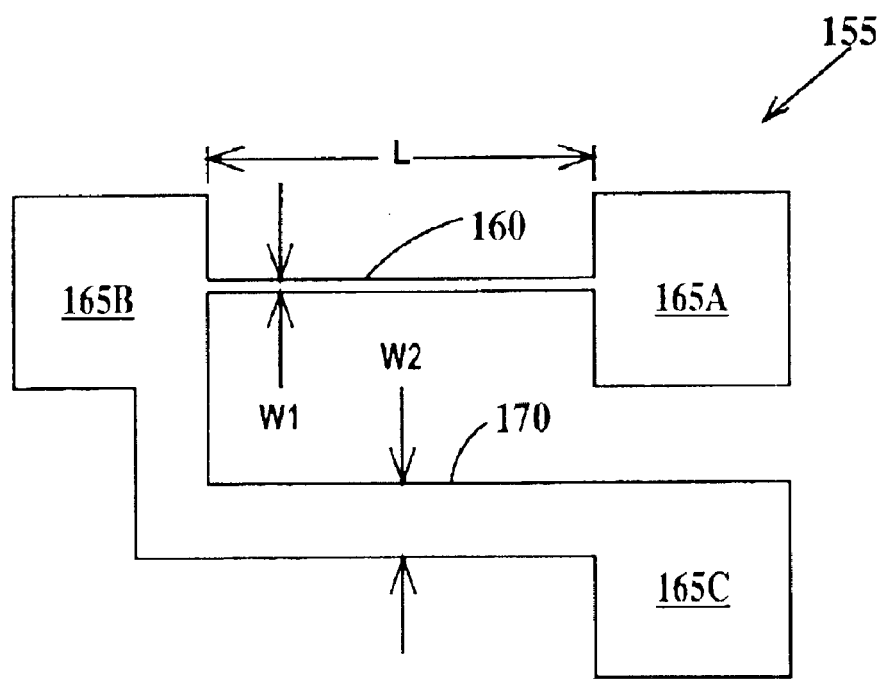
FIG. 4 is an illustrative plan view of a test structure for measuring linewidth.

FIG. 4 is an illustrative plan view of a test structure for measuring linewidth. In FIG. 4, a linewidth measurement structure 155 used to determine the linewidth "W1" of a conductive line 160 having a known length "L." Line 160 electrically connects pads 165A and 165B. A third pad 165C is electrically connected to pad 165B by a conductive line 170 having a width "W2." "W2" is much greater than "W1." Pads 165A, 165B, 165C and lines 160 and 170 are integrally formed from the same material by a damascene process as illustrated in FIGS. 5 through 10 and described below. To determine the width "W1" of line 160, a known current I is forced through line 160 from pad 165A to pad 165C. The voltage drop V is then measured across pads 165A and 165C. Combining the known value of I, the measured value of V, with the known length "L" and the $R_s$ value obtained from the Van der Pauw measurement discussed above, "W1" may be obtained from the following formula:

$$W1=(L \cdot R_s \cdot I)/V \qquad (3)$$

In one example, "L" is 10 microns or greater, "W2" is 3 microns or greater, and "W1" is about 0.05 to 1.0 microns.

Van der Pauw sheet resistance structure 135 and linewidth measurement structure 155 may be fabricated simultaneously.

Figure 5:
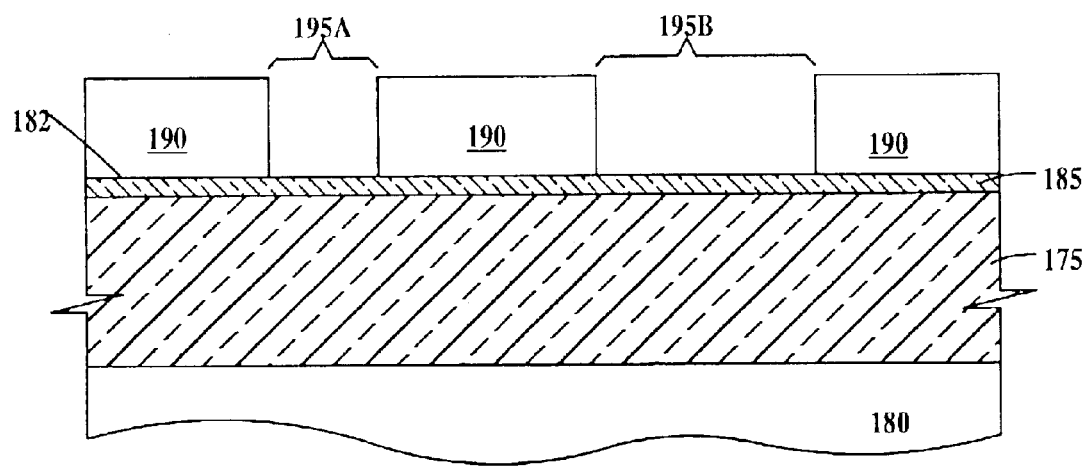
FIGS. 5 through 10C, are cross-sectional views illustrating a method of forming a damascene polysilicon line suitable for use in sheet resistance and linewidth measurement structures according to the present invention.

Turning to the method of fabricating Van der Pauw sheet resistance structure 135 and linewidth measurement structure 155, FIGS. 5 through 10C, are cross-sectional views illustrating a method of forming a damascene polysilicon line suitable for use in sheet resistance and linewidth measurement structures according to the present invention. In FIG. 5, an insulator 175 is formed on a substrate 180. An optional, standard antireflective coating (ARC) 182 is formed on a top surface 185 of insulator 175. Photoresist islands 190 are formed on top of ARC 182 by normal photolithographic processes. Photoresist islands define a first region 195A and a second region 195B. In one example insulator 175 is silicon oxide.

Figure 6:
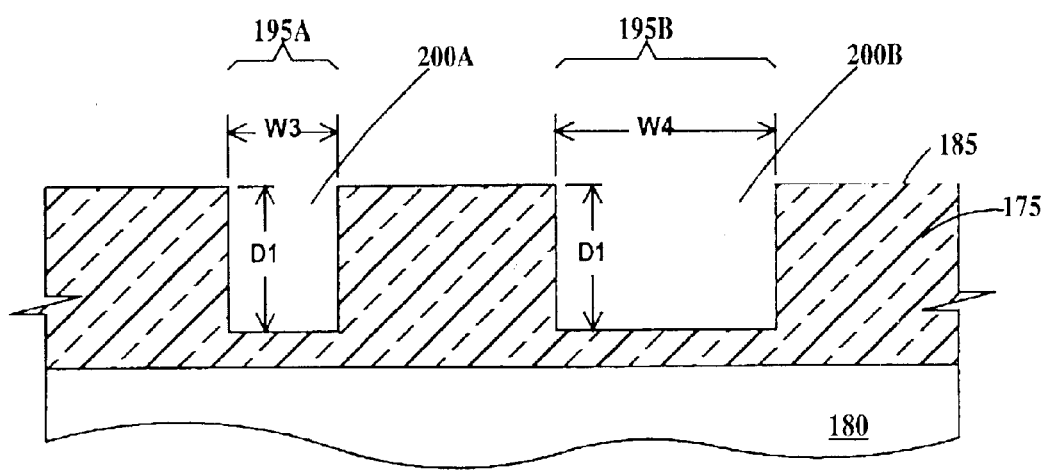

In FIG. 6, a first trench 200A is formed in insulator 175 in first region 195A and a second trench 200B is formed in the insulator in second regions 195B by a reactive ion etch (RIE) process. Resist islands 190 and ARC 182 are removed wet or dry means. First trench 200A is "W3" wide by "D1" deep. Second trench 200A is "W4" wide by "D1" deep. In one example, "D1" is about 0.1 to 1 micron deep and "W3" and "W4" are about 0.05 to 1 micron wide. For illustrative purposes, "W4" is shown as greater than "W3."

Figure 7:
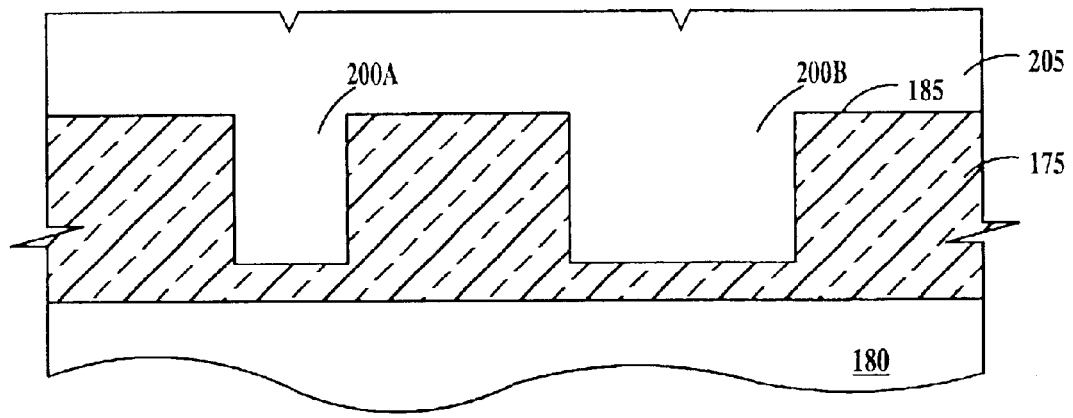

In FIG. 7, an intrinsic polysilicon layer 205 is deposited on top surface 185 of insulator 175 and in first and second trenches 200A and 200B, completely filling the first and second trenches.

Figure 8:
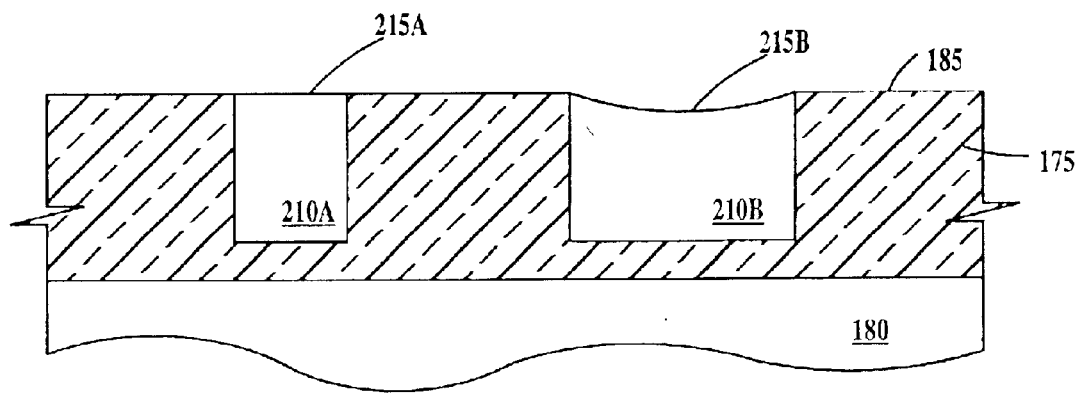

In FIG. 8, a CMP process is performed, removing polysilicon layer down to top surface 185 and thus forming a first conductive line 210A and a second conductor line 210B. First conductive line 210A has polished perfectly and a top surface 215A of the first conductive line is flat and co-planar with top surface 185 of insulator 175. Second conductive line 210B has not polished perfectly and a top surface 215B of the second conductive line is dished.

Figure 9:
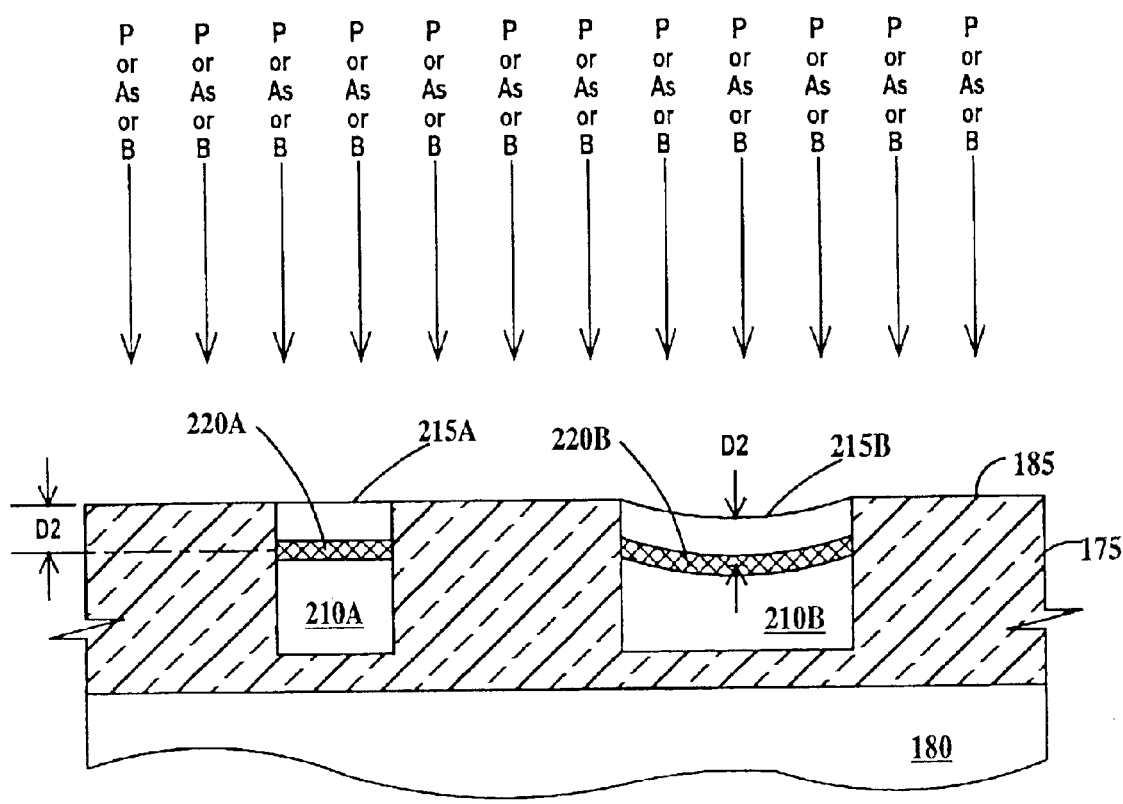

In FIG. 9, an ion implant is performed to form an implanted region 220A in conductive line 210A and an implanted region 220B in conductive line 210B. The peak of the ion implant distribution in region 220A is located a depth "D2" from top surface 215A and the peak of the ion implant distribution in region 220B is located a depth "D2" from top surface 215B. Note, that the profile of implanted regions 220A duplicates the profile of top surface 215A and the profile of implanted region 220B duplicate the profile of top surface 215B. In one example, about 5E14 to 3E15 atm/cm$^2$ of phosphorus is implanted at about 20 to 40 Kev. "D2" is about 500 to 1000 Å. Arsenic and boron may be used as the implanted species as well.

Depending on the amount of dopant implanted, the time a and temperature of anneal, cycles subsequent to the ion implantation step, three conductive line structures my be formed.

Figure 10A:
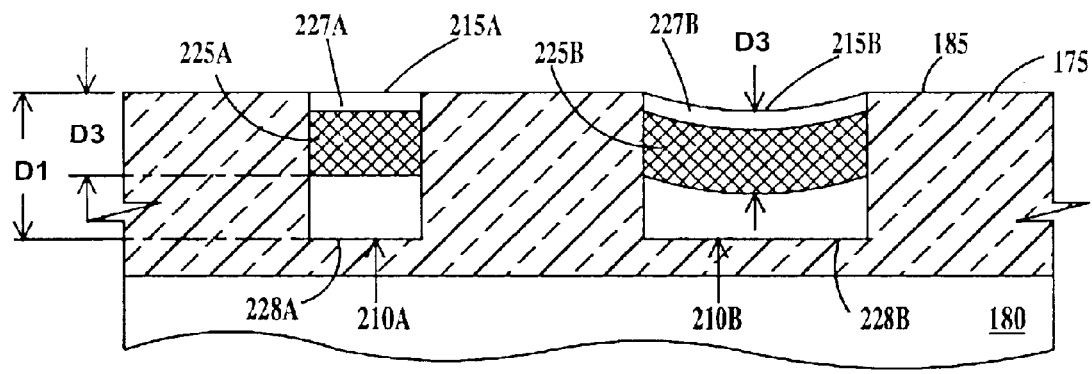

A first conductive line structure is illustrated in FIG. 10A. In FIG. 10A, a rapid thermal anneal (RTA) is performed to diffuse and activate the implanted species to form a doped polysilicon region 225A in first conductive line 210A and a doped polysilicon region 225B in second conductive line 210B. In one example, an RTA is performed for 5 seconds at about 850 to 1050° C. under an inert atmosphere. Doped polysilicon region 225A does not extend to a top surface 215A of first conductive line 210A leaving an upper region 227A having no ion implant supplied dopant and doped region 225A does not extend to a bottom 216A of first conductive line 210A leaving a lower region 228A having no ion implant supplied dopant. Doped polysilicon region 225B does not extend to top surface 215B of first conductive line 210B leaving an upper region 227B having no ion implant supplied dopant and doped region 225B does not extend to a bottom 216B of first conductive line 210B leaving a lower region 228B having no ion implant supplied dopant. Upper regions 227A and 227B and lower regions 228A and 228B may be intrinsic or lightly doped. In one example, upper regions 227A and 227B and lower regions 228A and 228B are doped to a concentration of 1E14 atm/cm$^3$.

Doped polysilicon regions 225A and 225B may be either saturated or un-saturated polysilicon. If doped regions 225A and 225B are saturated then lower regions 228A and 228B must be un-saturated or contain no dopant species. Un-saturated polysilicon is polysilicon having an active dopant species (phosphorus, arsenic, boron) concentration less than the solid solubility of the particular dopant at the anneal temperature. For example, the solid solubility of arsenic at 1100° C. is about 1E21 atm/cm$^3$, the solid solubility of boron at 1150° C. is about 4E20 atm/cm$^3$ and the solid solubility of phosphorus at 900° C. is about 2E20 atm/cm$^3$.

Doped polysilicon regions 225A and 225B extend a distance "D3" into first conductive line 210A and second conductive line 210B. In one example, the concentration of phosphorus in doped polysilicon regions 225A and 225B is about 1E19 to about 1E20 atm/cm$^3$ after the anneal step described above. Since a predetermined dose of phosphorus has been implanted, the resistivity of first and second lines 210A and 210B (being a function of the total amount of dopant implanted) is predetermined. Most of the current through first conductive line 210A will be carried by doped polysilicon region 225A. Most of the current forced through second conductive line 210B will be carried by doped polysilicon region 225B.

Figure 10B:
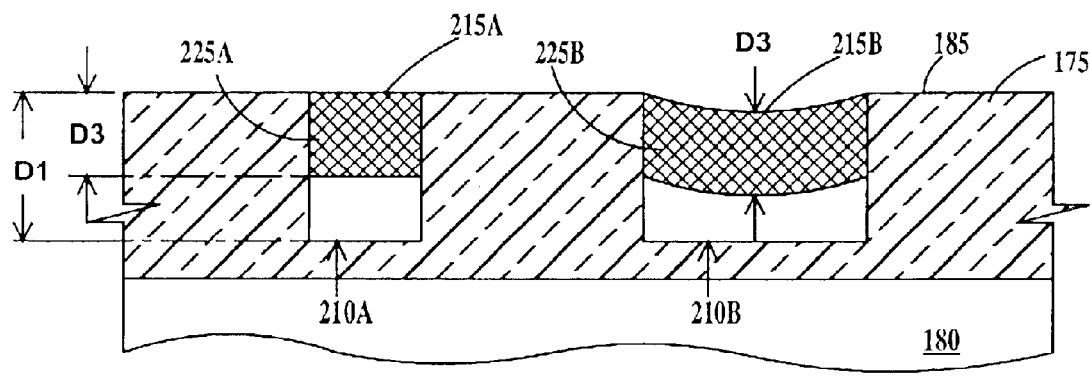

A second conductive line structure is illustrated in FIG. 10B. In FIG. 10B, doped polysilicon region 225A extends to top surface 215A of first conductive line 210A and doped polysilicon region 225B extends to top surface 215B of second conductive line 210B. There is more contact resistance with the structure of FIG. 10 than the structure of FIG. 11. A probe applied to (or via formed to contact) first and second conductive lines 210A and 210B illustrated in FIG. 10, should penetrate into doped polysilicon region 225A and 225B to minimize contact resistance.

Figure 10C:
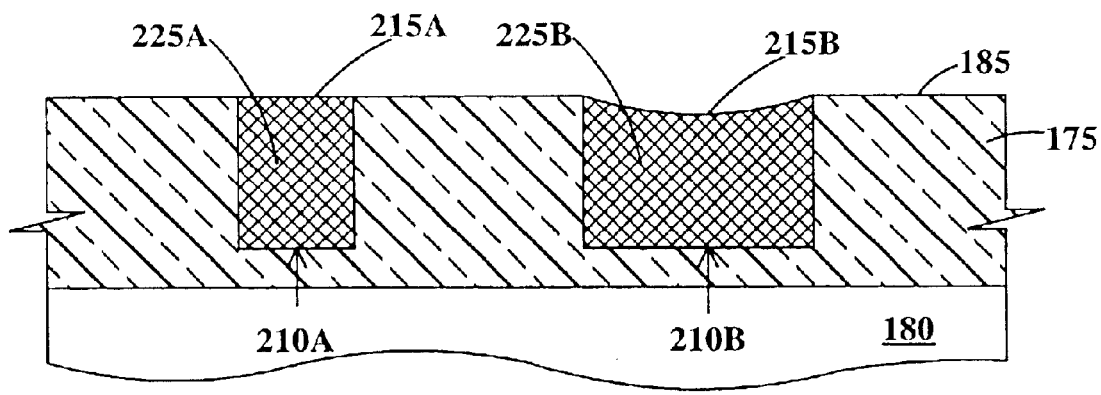

A third conductive line structure is illustrated in FIG. 10C. In FIG. 10C, doped polysilicon region 225A includes all of first conductive line 210A and doped polysilicon region 225B includes all of second conductive line 210B. Conductive regions 225A and 225B must be un-saturated.

First and second conductive lines 210A and 210B are illustrated to show insensitivity of the to the surface profile of a conductive line fabricated according to the present invention. The conductive line will behave, for the purpose of electrical measurements, as if it had a thickness equal to the thickness of its doped region. Further, that thickness will be the same for all lines within a die or across a wafer regardless of the line profiles caused by local CMP conditions.

The resistivity of conductive line 160 of FIG. 4, and conductive lines 210A and 210B of FIG. 10A through 10C is higher than the resistivity of most common materials used to form conductive lines such as aluminum, tungsten and copper. This is necessary in a measurement structure to ensure accurate voltage measurement.

Figure 11:
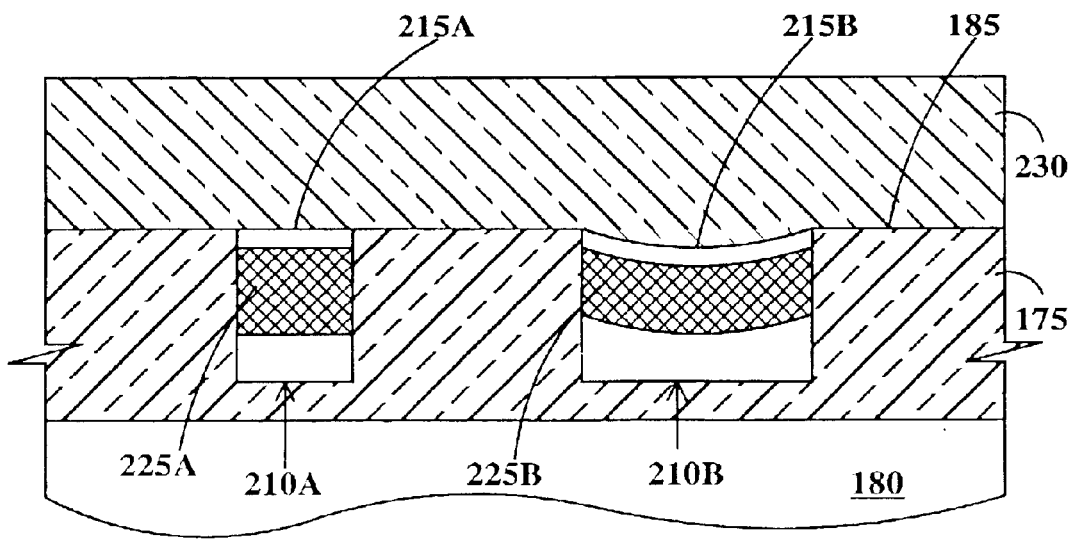
Figure 12:
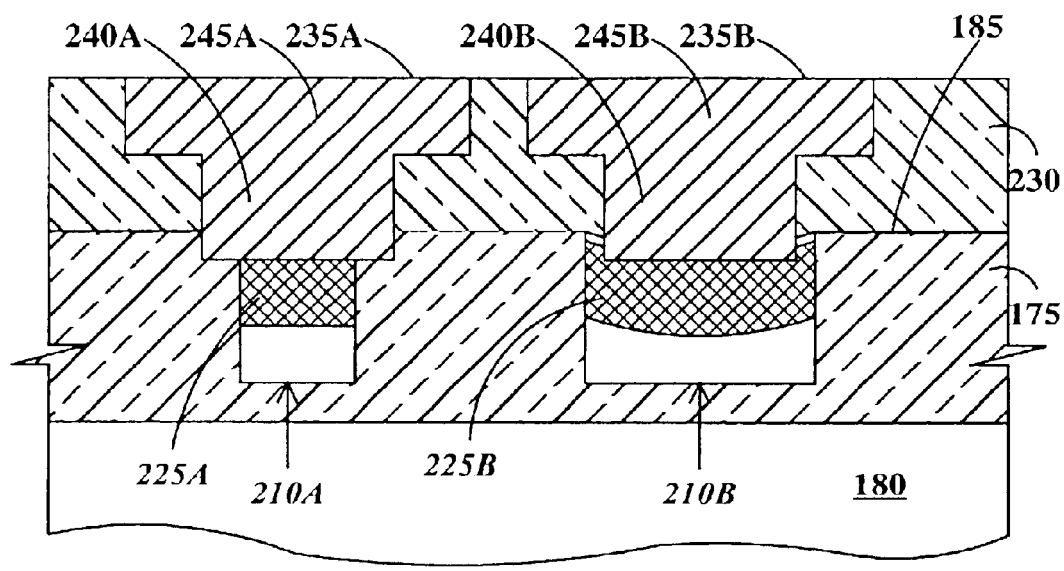

FIGS. 11 and 12 are cross-sectional views illustrating a method of forming contact to the structure of FIG. 10A through 10C to form a high precision polysilicon resistor according to the present invention. Particularly, the structure illustrated in FIG. 10A is used as an example in FIGS. 11 and 12.

In FIG. 11, a second insulating layer 230 is formed top surface 185 of insulating layer 175, over top surface 215A of first conductive line 210A and over top surface 215B of second conductive line 210B. In FIG. 12, a first via 240A integrally formed with a first conductive wire 245A by a dual damascene process contacts doped polysilicon region 225A of first conductive line 210A. A second via 240B integrally formed with a second conductive wire 245B by a dual damascene process contacts doped polysilicon region 225B of second conductive line 210B.

Figure 13:
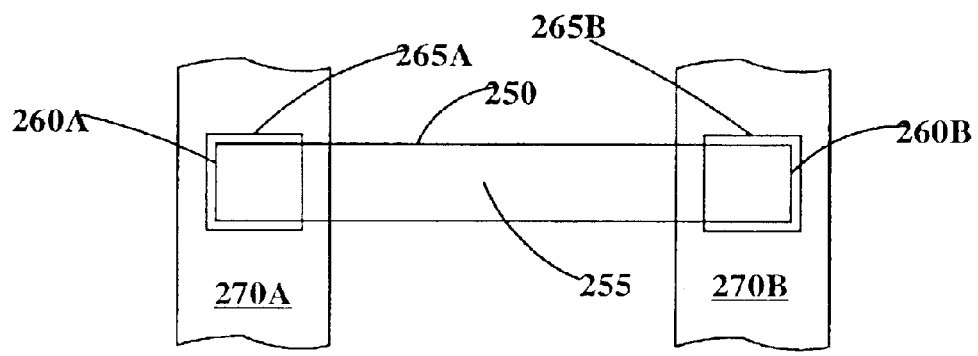
FIG. 13 is a top view of a high precision polysilicon resistor according to the present invention.

FIG. 13 is a top view of a high precision polysilicon resistor according to the present invention. In FIG. 13, resistor 250 is a damascene conductive line fabricated from intrinsic polysilicon having a doped upper region 255. Vias 260A and 260B contact ends 265A and 265B of resistor 250 respectively. Conductive wires 270A and 270B contact vias 265A and 265B respectively.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A resistor, comprising:

a damascened polysilicon line formed in a first insulator, said polysilicon line having a first region having a first dopant concentration and a second region having a second dopant concentration, said first dopant concentration being greater than said second dopant concentration;

a second insulator formed on a top surface of said first insulator;

a first via formed in said second insulator, said first via electrically contacting said first region at a first end of said polysilicon line; and a second via formed in said second insulator, said second via electrically contacting said first region at a second end of said polysilicon line.

2. The resistor of claim 1, wherein said first region is un-saturated.

3. The resistor of claim 1, wherein said first region extends to a top surface of said polysilicon line.

4. The resistor of claim 1, wherein said polysilicon line further includes a third region, said third region extending between said first region and a top surface of said polysilicon line, said third region having a third dopant concentration of zero to less than said first dopant concentration.

5. The resistor of claim 1, wherein a dopant of said first region is selected from the group consisting of phosphorus, arsenic and boron.

* * * * *